United States Patent
Kadow et al.

(10) Patent No.: US 7,868,643 B2
(45) Date of Patent: Jan. 11, 2011

(54) PROPORTIONAL REGULATION FOR OPTIMIZED CURRENT SENSOR PERFORMANCE

(75) Inventors: Christoph Kadow, Neuried (DE); Paolo Del Croce, Villach (AT)

(73) Assignee: Infineon Technologies AG, Neubiberg (DE)

( * ) Notice: Subject to any disclaimer, the term of this patent is extended or adjusted under 35 U.S.C. 154(b) by 209 days.

(21) Appl. No.: 12/260,829

(22) Filed: Oct. 29, 2008

(65) Prior Publication Data

US 2010/0102845 A1 Apr. 29, 2010

(51) Int. Cl.
*G01R 31/26* (2006.01)
(52) U.S. Cl. .................................................. 324/769
(58) Field of Classification Search ............... 324/765, 324/769, 158.1; 330/291; 327/51, 309; 323/285; 361/93.7
See application file for complete search history.

(56) References Cited

U.S. PATENT DOCUMENTS 7,365,559 B2 * 4/2008 Colbeck ..................... 324/769
7,605,598 B2 * 10/2009 Kelly ......................... 324/769

* cited by examiner

*Primary Examiner*—Ha Tran T Nguyen
*Assistant Examiner*—Tung X Nguyen
(74) *Attorney, Agent, or Firm*—Slater & Matsil, L.L.P.

(57) ABSTRACT

An integrated circuit device comprises a first transistor having a gate coupled to an output of a first operational amplifier, a second transistor having a threshold voltage proportional to a threshold voltage of the first transistor, the second transistor having a gate coupled to an inverting input of a second operational amplifier, an output of the second operational amplifier coupled to an inverting input of the first operational amplifier, a first resistor coupled between the second transistor gate and the inverting input of the second operational amplifier, and a second resistor coupled between the output of the second operational amplifier and the inverting input of the second operational amplifier, a ratio of the second resistor to the first resistor selected based upon a ratio of a production distribution of a transistor source voltage offset to a production distribution of a transistor threshold voltage mismatch.

17 Claims, 2 Drawing Sheets

PROPORTIONAL REGULATION FOR OPTIMIZED CURRENT SENSOR PERFORMANCE

TECHNICAL FIELD

The present invention relates to current sensing in power MOSFET integrated circuits.

BACKGROUND

In Smart Power integrated circuits (ICs), the current through a load transistor is measured using a sense transistor. The current in the load MOSFET is measured using a second MOSFET that has much smaller area. Ideally, the sense transistor and the load transistor are operated at the same operating point in which the transistors' source, gate, and drain voltages are identical. The ratio of the currents in the load and sense transistors is called KILIS ("K"):

$$K = \frac{I(\text{load})}{I(\text{sense})} \quad \text{(Eq. 1)}$$

The accuracy of K is an important characteristic of Smart Power ICs. However, scattering causes K to vary in each production due to several factors. At low drain currents, the two most important factors are the threshold voltage mismatch between the transistors and the voltage difference between the load and sense source voltages (source voltage offset).

The problem of minimizing the scatter of K at low currents is not solved by known techniques. Currently, two operation modes are typically used—normal operation and gate-back regulation. In normal operation, the load and sense transistors are operated at a constant gate voltage. In the low current regime, the drain voltage is very small and the source voltage offset leads to linear increase of the scatter in K with decreasing drain current. In gate-back regulation, the transistors are operated at constant drain voltage. In the low current regime, the gate overdrive (the gate-threshold voltage difference) is very small and the threshold voltage mismatch between the transistors leads to a linear increase of the scatter in K with decreasing drain current.

SUMMARY OF THE INVENTION

These and other problems are generally solved or circumvented, and technical advantages are generally achieved, by preferred embodiments of the present invention in which a power MOSFET transistor is biased using a controller circuit that is configured based upon a ratio between a transistor source voltage offset production distribution and a transistor threshold voltage mismatch production distribution.

In accordance with a preferred embodiment of the present invention, an integrated circuit device comprises a first transistor having a gate coupled to an output of a first operational amplifier, a second transistor having a threshold voltage proportional to a threshold voltage of the first transistor, the second transistor having a gate coupled to an inverting input of a second operational amplifier, an output of the second operational amplifier coupled to an inverting input of the first operational amplifier, a first resistor coupled between the second transistor gate and the inverting input of the second operational amplifier, and a second resistor coupled between the output of the second operational amplifier and the inverting input of the second operational amplifier, a ratio of the second resistor to the first resistor selected based upon a ratio of a production distribution of a transistor source voltage offset to a production distribution of a transistor threshold voltage mismatch.

The integrated circuit may further comprise a sense transistor having a gate coupled to the gate of the first transistor, a third operational amplifier having a first input coupled to a source of the first transistor and a second input coupled to a source of the sense transistor, and a current source controlled by an output of the third operational amplifier.

In accordance with another preferred embodiment of the present invention, a controller for a power MOSFET transistor comprises a reference MOSFET transistor having a gate, the reference MOSFET transistor biased to create a voltage at the gate, the gate voltage corresponding to a threshold voltage of the reference MOSFET transistor, a first amplifier circuit having an input coupled to the reference MOSFET transistor gate via a voltage divider circuit, the voltage divider circuit scaled in proportion to a ratio between a production distribution of a transistor source voltage offset and a production distribution of a transistor threshold voltage mismatch, and a second amplifier circuit coupled to an output of the first amplifier circuit, the second amplifier circuit having an output adapted to drive a gate of the power MOSFET transistor.

The voltage divider circuit may comprise a first resistor coupled between the gate of the reference MOSFET transistor and an inverting input of the first amplifier circuit, and a second resistor coupled between the output of the first amplifier circuit and the inverting input. The ratio of the second resistor to the first resistor may be equivalent to the ratio between a production distribution of a transistor source voltage offset and a production distribution of a transistor threshold voltage mismatch.

The mismatch of the threshold voltages, the difference in source voltage, and the operating point of the transistors strongly affects KILIS accuracy. The analytic model presented herein is used to quantify their influence. The threshold voltage mismatch is most important during gate-back regulation. The source voltage offset is most important during normal operation. In both operation modes the accuracy of KILIS increases linearly with increasing drain current. Gate-back-regulation gives better KILIS accuracy than normal operation if the drain voltage is small. However, for large drain voltages, gate-back-regulation results in worse KILIS accuracy than normal operation. A new operation mode, proportional regulation, is described herein that optimizes KILIS accuracy at low current densities.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The present invention provides many applicable inventive concepts that can be embodied in a wide variety of specific contexts. The specific embodiments discussed are merely illustrative of specific ways to make and use the invention, and do not limit the scope of the invention.

Figure 1:
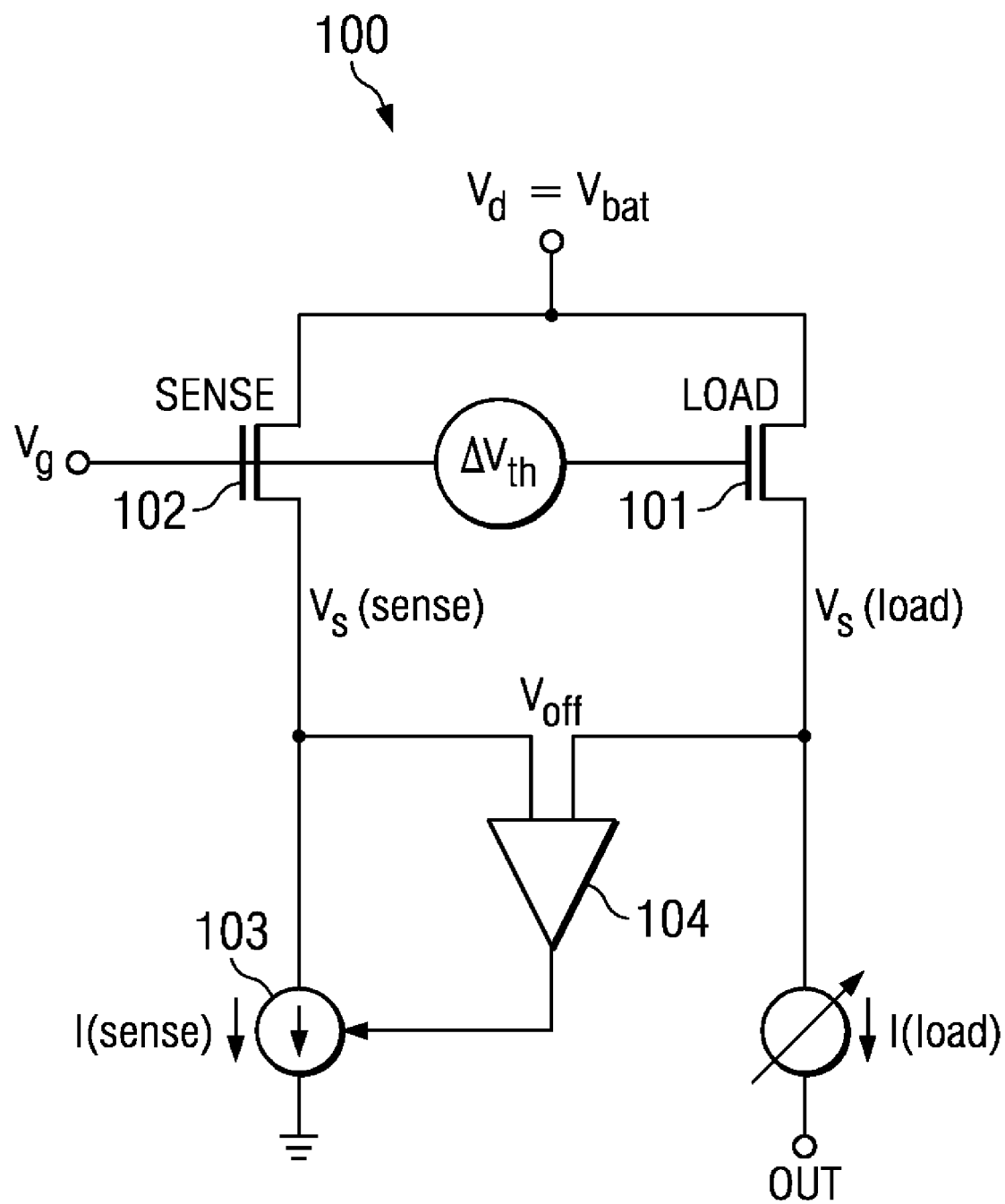
FIG. 1 illustrates a generic current measurement circuit in which a load MOSFET transistor is measured using a sense MOSFET transistor.

FIG. 1 illustrates a generic current measurement circuit 100 in which load MOSFET transistor 101 is measured using sense MOSFET transistor 102. To provide a highly accurate K value at low currents, the operating conditions of transistors 101, 102 need to be optimized such that the influence on K from the threshold voltage mismatch and the source voltage offset are minimized simultaneously. As illustrated further below, a quantitative model may be used to model how these two factors affect K. In a preferred embodiment, the operating conditions of transistors 101, 102 are optimized such that their influence on K is minimized. The present invention is directed to a circuit for obtaining optimal operation conditions in a Smart Power IC.

The accuracy of K may be specified as a function of drain current. The same drain current can be achieved with several combinations of gate voltage ("$V_{gs}$") and drain voltage ("$V_{ds}$"). One of these combinations provides an optimal operating condition for the best accuracy of K.

In an ideal world, K, the ratio of the drain currents of the load and sense transistors, would equal the geometric ratio ("$K_{geo}$") given by the areas ("A") or channel width ("W") of the two transistors:

$$K_{geo} = \frac{A(\text{load})}{A(\text{sense})} = \frac{W(\text{load})}{W(\text{sense})} \quad \text{(Eq. 2)}$$

In reality, K deviates from the ideal value, particularly at low currents. Transistors 101, 102 have slightly different operating points due to a threshold voltage mismatch and source voltage offset. The threshold voltage mismatch ("$\Delta V_{th}$") and source voltage offset ("$V_{off}$") are defined as follows:

$$\Delta V_{th} = V_{th}(\text{load}) - V_{th}(\text{sense}) \quad \text{(Eq. 3)}$$

$$V_{off} = V_s(\text{load}) - V_s(\text{sense}) \quad \text{(Eq. 4)}$$

FIG. 1 illustrates these error sources. The parameters $\Delta V_{th}$ and $V_{off}$ result in different operating conditions in load transistor 101 and sense transistor 102 and, therefore, cause the actual K to deviate from $K_{geo}$ in circuit 100. Because of production variations, there is a statistical scatter in $\Delta V_{th}$ and in $V_{off}$. This scatter may be characterized by the standard deviations $\sigma(V_{off})$ and $\sigma(\Delta V_{th})$, respectively. The production variations result in a distribution of K that may be characterized by $\sigma(K)$. It has been observed that these deviations are largest at low drain current densities ("J"). This is expected because the gate-threshold voltage difference (i.e. gate overdrive, "$V_{gs}-V_{th}$") and the drain voltage ("$V_{ds}$") are small at low drain current densities J and, therefore, the effects of $\Delta V_{th}$ and $V_{off}$ are largest for low values of J.

Circuit 100 illustrates the components of the KILIS measurement. As described above, due to $\Delta V_{th}$ and $V_{off}$, load transistor 101 and sense transistor 102 operate at slightly different operating points. The current in the sense path ("I (sense)") is set by current source 103, which is in turn controlled by operational amplifier 104. The voltage offset $V_{off}$ is the input to operation amplifier 104. The threshold voltage mismatch $\Delta V_{th}$ and the input voltage offset $V_{off}$ cause slightly different operating points for the load and sense transistors 101, 102.

Equations 1 to 4 can be combined as show in Equation 5 to express J as a function of the gate overdrive $V_{gs}-V_{th}$ and drain voltage $V_{ds}$:

$$\frac{K}{K_{geo}} = \frac{J(\text{load})}{J(\text{sense})} = \frac{J(V_{gs}-V_{th}-\Delta V_{th}-\Delta V_{off}, V_{ds}-V_{off})}{J(V_{gs}-V_{th}, V_{ds})} \quad \text{(Eq. 5)}$$

Equation 5 is the ratio of ideal KILIS value, K, to the actual value of KILIS, $K_{geo}$. Using first order Taylor expansion, Equation 5 can be simplified to:

$$\frac{K}{K_{geo}} = 1 - \frac{1}{J} \cdot \frac{\partial J}{\partial(V_{gs}-V_{th})} \cdot (\Delta V_{th} - V_{off}) - \frac{1}{J} \cdot \frac{\partial J}{\partial V_{ds}} \cdot V_{off} \quad \text{(Eq. 6)}$$

Typically, $V_{off}$ is at least a factor of 10 smaller than $\Delta V_{th}$. Therefore, $V_{off}$ can be neglected in the second term on the right side of Equation 6. The current ratio in Equation 6 can be simplified to:

$$\frac{K}{K_{geo}} = 1 - \frac{1}{J} \cdot \frac{\partial J}{\partial(V_{gs}-V_{th})} \cdot \Delta V_{th} - \frac{1}{J} \cdot \frac{\partial J}{\partial V_{ds}} \cdot V_{off} \quad \text{(Eq. 7)}$$

where J is the current density and $K_{geo}$ is the ratio of channel widths of load and sense transistors. Equation 7 equates the ratio between the ideal and real values of KILIS to the three terms on the right side of the equation. The second term on the right side of equation 7 is associated with the threshold voltage mismatch, $\Delta V_{th}$. The third term on the right side of Equation 7 is associated with the source voltage offset, $V_{off}$. In this approximation, K is a linear function of $\Delta V_{th}$ and $V_{off}$. $\Delta V_{th}$ and $V_{off}$ vary statistically over production. Their distributions are characterized by their mean values and their standard deviations $\sigma(\Delta V_{th})$ and $\sigma(V_{off})$. Due to these variations, K also varies over production. K is characterized by its mean value and standard deviation $\sigma(K)$. Based on Equation 7, the standard deviations are related in the following way:

$$\left[\sigma\left(\frac{K}{K_{geo}}\right)\right]^2 = \left[\left|\frac{1}{J} \cdot \frac{\partial J}{\partial(V_{gs}-V_{th})}\right| \cdot \sigma(\Delta V_{th})\right]^2 + \left[\left|\frac{1}{J} \cdot \frac{\partial J}{\partial V_{ds}}\right| \cdot \sigma(V_{off})\right]^2 \quad \text{(Eq. 8)}$$

Equation 8 relates the operating points of the transistors 101, 102 and the statistical spreads in $\Delta V_{th}$ and $V_{off}$ to the distribution of K. Accordingly, Equation 8 may be used to model the accuracy of K as it varies over production. To obtain a high accuracy of K, the distribution of K needs to be narrow—i.e. $\sigma(K)$ must be minimized for each value of J. Because the same J can be achieved with different combinations $V_{gs}$ and $V_{ds}$, there are optimal operating conditions for the best accuracy of K. The accuracy of K is most critical when J depends linearly on $V_{ds}$ and the gate-overdrive, $V_{gs}-V_{th}$. Equation 8 may be further simplified by assuming a simple relationship for the term $J(V_{gs}-V_{th}, V_{ds})$. In the linear region, the current density of a MOSFET may be expressed as:

$$J = C^* \cdot (V_{gs}-V_{th}) \cdot V_{ds} \quad \text{(Eq. 9)}$$

Note that the term C* is a MOSFET-specific constant. The constant C* is usually labeled "K," but C* is used here instead of the usual variable in order to avoid confusion between this parameter and the current ratio parameter K (KILIS). If J follows Equation 9, then Equation 8 has a minimum value if the ratio of $(V_{gs}-V_{th})$ and $V_{ds}$ equals the ratio of $\sigma(\Delta V_{th})$ and $\sigma(V_{off})$:

$$\frac{V_{gs} - V_{th}}{\sigma(\Delta V_{th})} = \frac{V_{ds}}{\sigma(V_{off})} \quad \text{(Eq. 10)}$$

If load and sense transistors 101, 102 are operated such that Equation 10 is fulfilled for each current, then $\sigma(K)$ is minimized and the accuracy of K is maximized for each J. Therefore, in a Smart Power IC, the drain current needs to be measured and a control loop needs to generate an appropriate combination of $V_{gs}$ and $V_{ds}$ so that Equation 10 if satisfied for the measurement current. Preferably, $\sigma(\Delta V_{th})$ and $\sigma(V_{off})$ are determined experimentally beforehand. Because $(V_{gs}-V_{th})$ and $V_{ds}$ are proportional to each other, this operating mode is referred to herein as proportional regulation. The optimal ratio $(V_{gs}-V_{th})$ to $V_{ds}$ is given by the ratio of $\sigma(\Delta V_{th})$ and $\sigma(V_{off})$. If the load and sense transistor are operated at such bias conditions in the proportional regulation mode, then the resulting $\sigma(K)$ is given by Equation 11:

$$\sigma\left(\frac{K}{K_{geo}}\right) = \sqrt{C^* \cdot \sigma(\Delta V_{th}) \cdot \sigma(V_{off})} \cdot \sqrt{\frac{1}{J}} \quad \text{(Eq. 11)}$$

As shown in Equation 11, $\sigma(K)$ increases with the inverse of the square-root of the current density J. This is in contrast to known approaches in which $\sigma(K)$ increases with the inverse of J. The drain current dependence is less severe than for normal operation and gate-back regulation. Accordingly, the proportional regulation mode, $\sigma(K)$ is minimized for all current densities J in the low current regime. Additionally, $\sigma(K)$ increases more slowly with decreasing J than in other operating modes.

Embodiments of the present invention operate the load and source transistors 101, 102 for a given current density at a combination of gate-overdrive and drain-source voltage that is given by the standard deviation of the threshold voltage mismatch and the standard deviation of the source offset voltage. This operating condition minimizes the standard deviation of K for a give current density. As a result, the accuracy of K is maximized over production variations.

Figure 2:
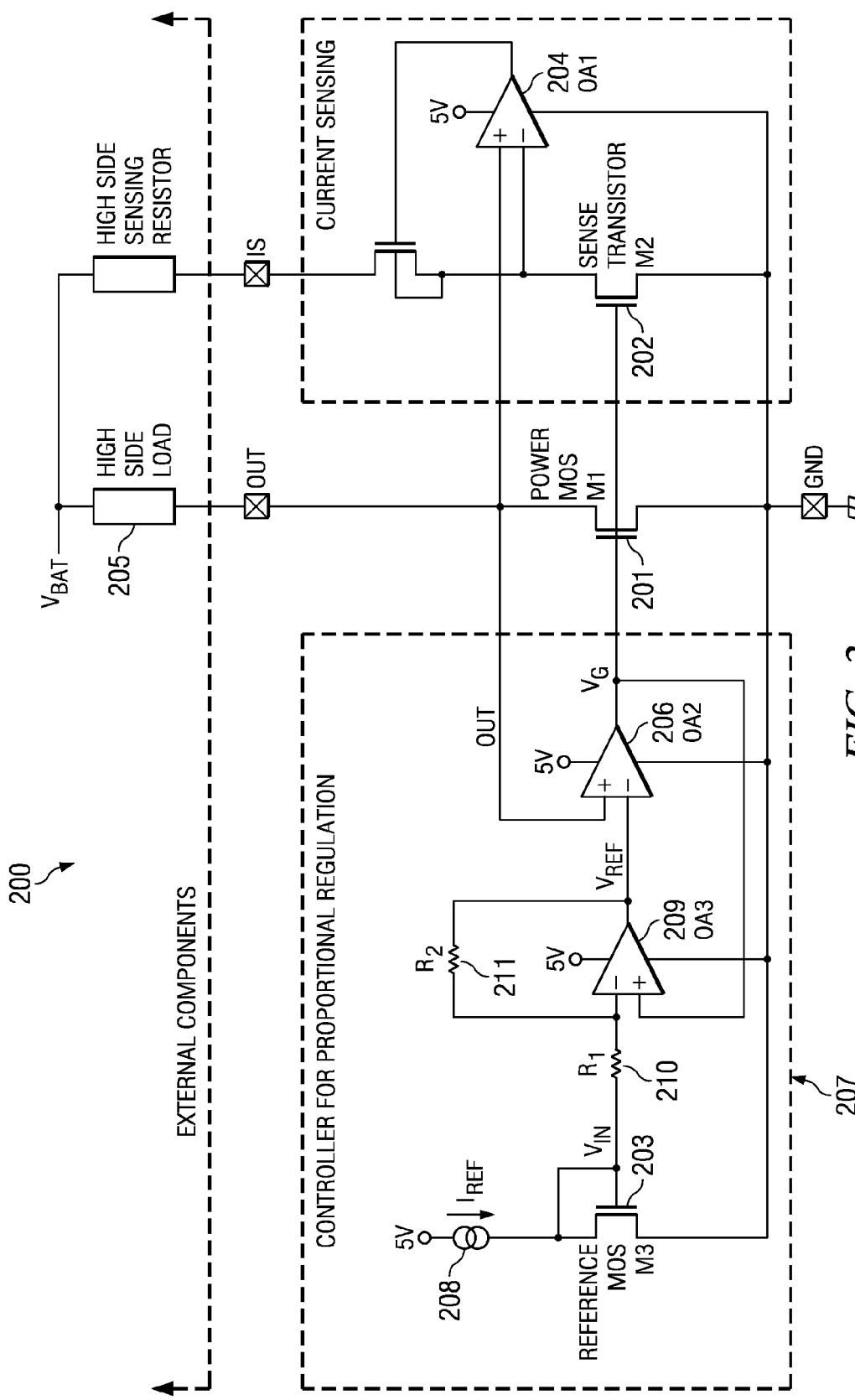
FIG. 2 illustrates an exemplary low side switch using a controller according to one embodiment of the invention.

FIG. 2 illustrates one embodiment of the invention for a low side power switch. Transistor M1 201 is a power MOS device that provides switching functionality in circuit 200. In order to simplify the schematic shown in FIG. 2, the circuitry for switching transistor M1 201 ON and OFF with the proper timing is not shown, but would be known to one of ordinary skill in the art. For purposes of the circuit illustrated in FIG. 2, transistor M1 201 is assumed to be in the ON state.

Transistor M2 202 is a power MOS device having a smaller area than transistor M1 201. Transistor M2 202 is used together with operational amplifier 1 (OA1) 204 for sensing the current flowing in transistor M1 201 and external load 205. $\sigma(\Delta V_{off})$ is the one sigma offset at OA1 204. Current sensing works effectively for $V_{ds} \gg \sigma(\Delta V_{off})$ at transistor M1 201. In the low current regime, the condition would be violated, so $V_{ds}$ at transistor M1 201 needs to be limited. Otherwise, the accuracy in current sensing would be lost. Operation amplifier 2 (OA2) 206 is introduced for this purpose. OA2 206 sets the minimum value to $V_{ds}=V_{REF}$.

In typical Smart Power IC circuits, $V_{REF}$ is a constant value in the range of 10-50 mV. However, for embodiments of the present invention, this value is not optimum. The value of $V_{REF}$ can be varied according to Equation 10 to minimize the overall error in output current sensing error $\sigma(\Delta V_{off})$ at OA1 204 and error $\sigma(\Delta V_{th})$ at transistors M1-M2.

Circuit 207 provides the regulation required for Equation 10, which can be rewritten as:

$$V_{ds} = (V_{ds} - V_{th})\frac{\sigma(V_{off})}{\sigma(\Delta V_{th})} \quad \text{(Eq. 12)}$$

Transistor M3 203 may be small in proportion to transistor M1 201. For purposes of FIG. 2, it is assumed that the threshold voltage, $V_{th-M1}$, of transistor M1 201 is equal to the threshold voltage, $V_{th-M3}$, of transistor M3 203. Transistor M3 203 is used to extract the power MOS threshold $V_{th}$ by means of a very small biasing current $I_{REF}$ 208. Operational amplifier 3 (OA3) 209 provides a reference voltage to OA2 206. The value of this reference voltage, $V_{REF}$, is shown in Equation 13:

$$V_{REF} = -(V_{IN} - V_G) \cdot \frac{R_2}{R_1} = (V_{gs} - V_{th}) \cdot \frac{R_2}{R_1} \quad \text{(Eq. 13)}$$

where $R_1$ and $R_2$ are the values of resistors $R_1$ 210 and R2 211, respectively, that are used to bias OA3 209.

Comparing equations 12 and 13, it follows that if $V_{REF}=V_{ds}$, then $$\frac{\sigma(V_{off})}{\sigma(V_{th})} = \frac{R_2}{R_1} \quad \text{(Eq. 14)}$$

Accordingly, if Equation 14 is satisfied, then OA2 206 will drive the gate of transistor M1 201 to set the optimal $V_{ds}$ for transistor M1 201.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device, comprising:
   a first transistor having a gate coupled to an output of a first operational amplifier;
   a second transistor having a threshold voltage proportional to a threshold voltage of the first transistor;

the second transistor having a gate coupled to an inverting input of a second operational amplifier;

an output of the second operational amplifier coupled to an inverting input of the first operational amplifier;

a first resistor coupled between the second transistor gate and the inverting input of the second operational amplifier; and a second resistor coupled between the output of the second operational amplifier and the inverting input of the second operational amplifier, a ratio of the second resistor to the first resistor selected based upon a ratio of a production distribution of a transistor source voltage offset to a production distribution of a transistor threshold voltage mismatch.

2. The integrated circuit of claim 1, further comprising:
a sense transistor having a gate coupled to the gate of the first transistor;
a third operational amplifier having a first input coupled to a drain of the first transistor and a second input coupled to a drain of the sense transistor; and
a current source controlled by an output of the third operational amplifier.

3. The integrated circuit of claim 1, wherein a non-inverting input of the first operational amplifier is coupled to a drain of the first transistor.

4. The integrated circuit of claim 1, wherein a non-inverting input of the second operational amplifier is coupled to the gate of the first transistor.

5. The integrated circuit of claim 1, wherein the first transistor is a power MOSFET transistor.

6. A controller for a power MOSFET transistor, comprising:
a reference MOSFET transistor having a gate, the reference MOSFET transistor biased to create a voltage at the gate, the gate voltage corresponding to a threshold voltage of the reference MOSFET transistor;
a first amplifier circuit having an input coupled to the reference MOSFET transistor gate via a voltage divider circuit, the voltage divider circuit scaled in proportion to a ratio between a production distribution of a transistor source voltage offset and a production distribution of a transistor threshold voltage mismatch; and
a second amplifier circuit coupled to an output of the first amplifier circuit, the second amplifier circuit having an output adapted to drive a gate of the power MOSFET transistor.

7. The controller of claim 6, wherein the voltage divider circuit comprises:
a first resistor coupled between the gate of the reference MOSFET transistor and an inverting input of the first amplifier circuit; and
a second resistor coupled between the output of the first amplifier circuit and the inverting input.

8. The controller of claim 7, wherein the ratio of the second resistor to the first resistor is equivalent to the ratio between a production distribution of a transistor source voltage offset and a production distribution of a transistor threshold voltage mismatch.

9. The controller of claim 6, wherein the second amplifier circuit has a non-inverting input coupled to a source voltage of the power MOSFET transistor.

10. The controller of claim 6, wherein the first amplifier circuit has a non-inverting input coupled to a gate voltage of the power MOSFET transistor.

11. The controller of claim 6, wherein the first amplifier circuit is coupled to an inverting input of the second amplifier circuit.

12. A method of operating a load transistor and a sense transistor in an integrated circuit, the load transistor biased using a gate voltage, the load transistor having a threshold voltage and a drain voltage, and the load transistor having a gate overdrive voltage equal to a difference between the gate voltage and the threshold voltage, comprising:
regulating the biasing of the load transistor so that a ratio of the gate overdrive voltage to the drain voltage equals a ratio of a production distribution of a threshold voltage mismatch to a production distribution of a source voltage offset.

13. The method of claim 12, wherein the threshold voltage mismatch is a difference between the threshold voltage of the load transistor and a threshold voltage of the sense transistor, and wherein the source voltage offset is a difference between a source voltage of the load transistor and a source voltage of the sense transistor.

14. The method of claim 12, further comprising:
biasing a reference transistor so that a reference threshold voltage can be detected at a gate of the reference transistor, the reference transistor being proportional to the load transistor and having a smaller area than the load transistor; and
using the reference threshold voltage to control the biasing of the load transistor.

15. An integrated circuit, comprising:
a load transistor biased using a gate voltage, the load transistor having a threshold voltage and a drain voltage, and the load transistor having a gate overdrive voltage equal to a difference between the gate voltage and the threshold voltage;
a sense transistor coupled to the load transistor and configured to measure a current passing through the load transistor; and
a biasing circuit generating a gate voltage for regulating the biasing of the load transistor, the gate voltage selected so that a ratio of the gate overdrive voltage to the drain voltage equals a ratio of a production distribution of a threshold voltage mismatch to a production distribution of a source voltage offset.

16. The integrated circuit of claim 15, wherein the threshold voltage mismatch is a difference between the threshold voltage of the load transistor and a threshold voltage of the sense transistor, and wherein the source voltage offset is a difference between a source voltage of the load transistor and a source voltage of the sense transistor.

17. The integrated circuit of claim 15, wherein the biasing circuit further comprises:
a reference transistor proportional to the load transistor and having a smaller area than the load transistor, a reference threshold voltage detectable at a gate of the reference transistor and used to control the biasing of the load transistor.

* * * * *